US006836224B1

(12) United States Patent
Vierling et al.

(10) Patent No.: US 6,836,224 B1
(45) Date of Patent: Dec. 28, 2004

(54) METHOD FOR ASSIGNING CODED INCREMENTAL VALUES

(75) Inventors: Lou Vierling, E. Detroit, MI (US); John C. McCoy, Fayetteville, TN (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

(21) Appl. No.: 09/702,714

(22) Filed: Oct. 31, 2000

Related U.S. Application Data

(60) Provisional application No. 60/162,834, filed on Nov. 1, 1999.

(51) Int. Cl.[7] .......... H03M 7/00

(52) U.S. Cl. .......... 341/50; 73/118.1; 73/119 A; 701/114; 123/490

(58) Field of Search .......... 73/119 A, 118.1; 341/50; 701/114; 123/490

(56) References Cited

U.S. PATENT DOCUMENTS

| | | | | |
|---|---|---|---|---|
| 3,786,344 A | | 1/1974 | Davis | |
| 4,292,841 A | * | 10/1981 | Wesley | 73/119 A |
| RE31,391 E | | 9/1983 | Davis | |
| 4,972,293 A | * | 11/1990 | Verner | 361/187 |
| 4,972,996 A | | 11/1990 | Cerny | |
| 4,975,848 A | * | 12/1990 | Abe et al. | 364/424.03 |
| 5,049,879 A | * | 9/1991 | Symonds | 341/10 |
| 5,235,954 A | | 8/1993 | Sverdlin | |
| 5,454,259 A | * | 10/1995 | Ishii et al. | 73/118.1 |
| 5,535,620 A | * | 7/1996 | Nichols | 73/118.1 |
| 5,535,621 A | * | 7/1996 | Glidewell et al. | 73/119 A |
| 5,575,264 A | * | 11/1996 | Barron | 123/486 |
| 5,712,424 A | * | 1/1998 | Reed | 73/115 |
| 5,720,261 A | | 2/1998 | Sturman | |
| 5,721,375 A | * | 2/1998 | Bidner | 73/118.1 |
| 5,829,460 A | | 11/1998 | Acevedo | |
| 5,954,030 A | | 9/1999 | Sturman | |
| 6,036,120 A | | 3/2000 | Varble | |
| 6,065,684 A | | 5/2000 | Varble | |
| 6,112,720 A | * | 9/2000 | Matta | 123/446 |
| 6,120,005 A | | 9/2000 | Wright | |

* cited by examiner

*Primary Examiner*—Brian Young
*Assistant Examiner*—Khai Nguyen

(57) ABSTRACT

A method for identifying particular characteristics of a physical system includes assigning codes information to the system based upon two distinct characteristics. The code increases in value, with increasing code numbers being assigned to combination of the characteristics in such a way that between any two adjacent code values, only one of the two characteristics change, and the increasing value only changes by one value level.

9 Claims, 4 Drawing Sheets

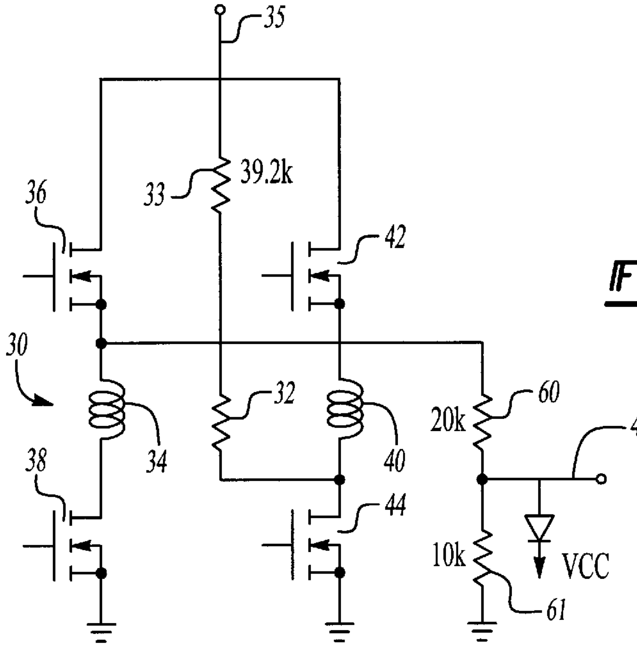
Fig-1
Fig-2
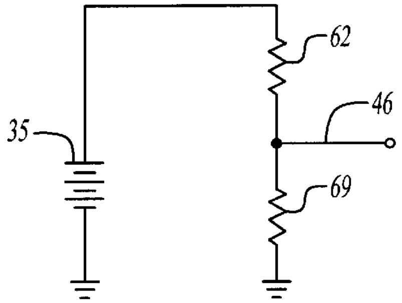
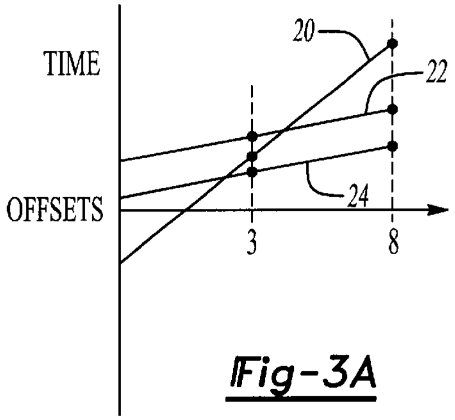
Fig-3A
| | | LOW | MED | HIGH |
|---|---|---|---|---|
| SLOPE | HIGH | 1 | 2 | 3 |
| | MED | 4 | 5 | 6 |
| | LOW | 7 | 8 | 9 |
| | | OFFSET | | |
Fig-3B

| SLOPE | OFFSET: LOW | MED | HIGH |
|---|---|---|---|
| HIGH | 1 | 2 | 3 |
| MED | 8 | 9 | 4 |
| LOW | 7 | 6 | 5 |

Fig-4

| | | | |
|---|---|---|---|
| 1 | 2 | 3 | 4 |
| 8 | 7 | 6 | 5 |
| 9 | 10 | 11 | 12 |
| 16 | 15 | 14 | 13 |

Fig-5

| | | | |
|---|---|---|---|
| 2 | 3 | 6 | 7 |
| 1 | 4 | 5 | 8 |
| 16 | 13 | 12 | 9 |
| 15 | 14 | 11 | 10 |

Fig-6

| | | | |
|---|---|---|---|
| 1 | 16 | 11 | 10 |
| 2 | 15 | 12 | 9 |
| 3 | 14 | 13 | 8 |
| 4 | 5 | 6 | 7 |

Fig-7

Fig-8

| | | | |
|---|---|---|---|
| 1 | 2 | 3 | 4 |
| 8 | 7 | 6 | 5 |

METHOD FOR ASSIGNING CODED INCREMENTAL VALUES

This application claims priority to U.S. Provisional Application No. 60/162,834 filed on Nov. 1, 1999.

BACKGROUND OF THE INVENTION

This invention relates to a method of assigning coded quantities to provide an identification of particular aspects of a physical system. The codes preferably provide information with regard to at least two characteristics of the physical system, and are assigned in such a way that any misreading is likely to have minimal effect.

The present invention is specifically directed to a method of providing a coded identifier through a voltage associated with particular types of fuel injectors. The identifier provides feedback to a control for driving the fuel injectors on characteristics of the fuel injectors. The fuel injectors can vary with manufacturing tolerances, and by sensing the identifying voltage the control can identify how the particular fuel injector would be best controlled.

A series of distinct voltages are associated with different combinations of two characteristics. The control reads an electronic signal influenced by the voltage, and can thus identify the particular code, and thus the combination of characteristics. This basic system is disclosed in co-pending patent application Ser. No. 09/536,365, filed on Mar. 27, 2000.

One challenge with this type of system would be identification errors, in which the control misidentified the particular signal as being a code other than the proper code. It would be desirable to minimize the detrimental effect of when a particular monitored voltage is associated with particular set of characteristics by the control, but wherein the injector actually possesses a different set of characteristics than that which the control has identified. A number of different factors can influence and cause such errors. As examples, the disclosed embodiment utilizes resistors to provide the code voltage. As with any manufactured item, there are tolerances within the resistors. Thus, the resistors themselves can result in voltage errors. Moreover, the voltage sources which drive the system may also vary from a predicted value, and can also result in error.

The present invention minimizes the ill effect of any such reading error by assigning the coded information in a fashion other than beginning at the same point within a row or column and returning to this beginning point. This will be explained below. If the codes are assigned in rows and columns, then it will be true that adjacent code numbers can be associated with physical states of the system wherein both characteristics are different, and the characteristics may be different by several factors.

Any misreading error is likely to be between adjacent code values. The present invention minimizes the detrimental effect of any misreading error by assigning adjacent code values in such a way that between adjacent values, only one characteristic changes, and that characteristic only changes by a one value.

SUMMARY OF THE INVENTION

In the disclosed embodiment of this invention, characteristics are associated with a particular system in at least two sets of different values. The combination of the two characteristics are assigned a code value associated with a physical quantity, such that each next increasing code value is assigned to a combination of the two characteristics that only changes one of the characteristics. Moreover, the characteristic that changes only changes by one value between any two adjacent code values.

The invention is disclosed for associating voltages and codes for two characteristics of a fuel injector, however, the method for identifying code values and storing data can be utilized for many other physical systems. Most preferably, the code is identified by an identifying resistor. Further, most preferably the voltage value differences between adjacent codes increase as the absolute value of the voltage increases. This aspect is explained in greater detail in the co-pending patent application entitled “Utilizing Increasing Width for Identification Voltages,” Ser. No. 09/686,253 filed Oct. 11, 2000.

In a disclosed embodiment of this invention, the code values are assigned such that if they were arranged in an array, they would extend in a spiral fashion. In other embodiments, the values extend in a back and force fashion, in a serpentine fashion, or in a “necklace” or “double-u” arrangement. While the majority of embodiments are two dimensional, one embodiment does extend the invention to a three dimensional array, wherein there are three characteristics being identified. Moreover, while all of the specifically listed embodiments are “square”, non-square arrays also benefit from this invention.

These and other features of the present invention can be best understood from the following specification and drawings, following which is a brief description.

BRIEF DESCRIPTION OF THE DRAWINGS

FIG. 1 is a schematic view of a fuel injector driver circuit.

FIG. 2 is a view of the effective circuit portion providing an identifying code according to this invention.

FIG. 3A graphically shows how two quantities of a fuel injector may be identified.

FIG. 3B shows a first non-desirable way of storing the FIG. 3A information.

FIG. 4 shows a preferred method of storing the information.

FIG. 5 shows another embodiment of how to store the inventive information.

FIG. 6 shows an alternative embodiment.

FIG. 7 shows yet another alternative embodiment.

FIG. 8 shows yet another alternative embodiment.

DETAILED DESCRIPTION OF A PREFERRED EMBODIMENT

Figure 9:
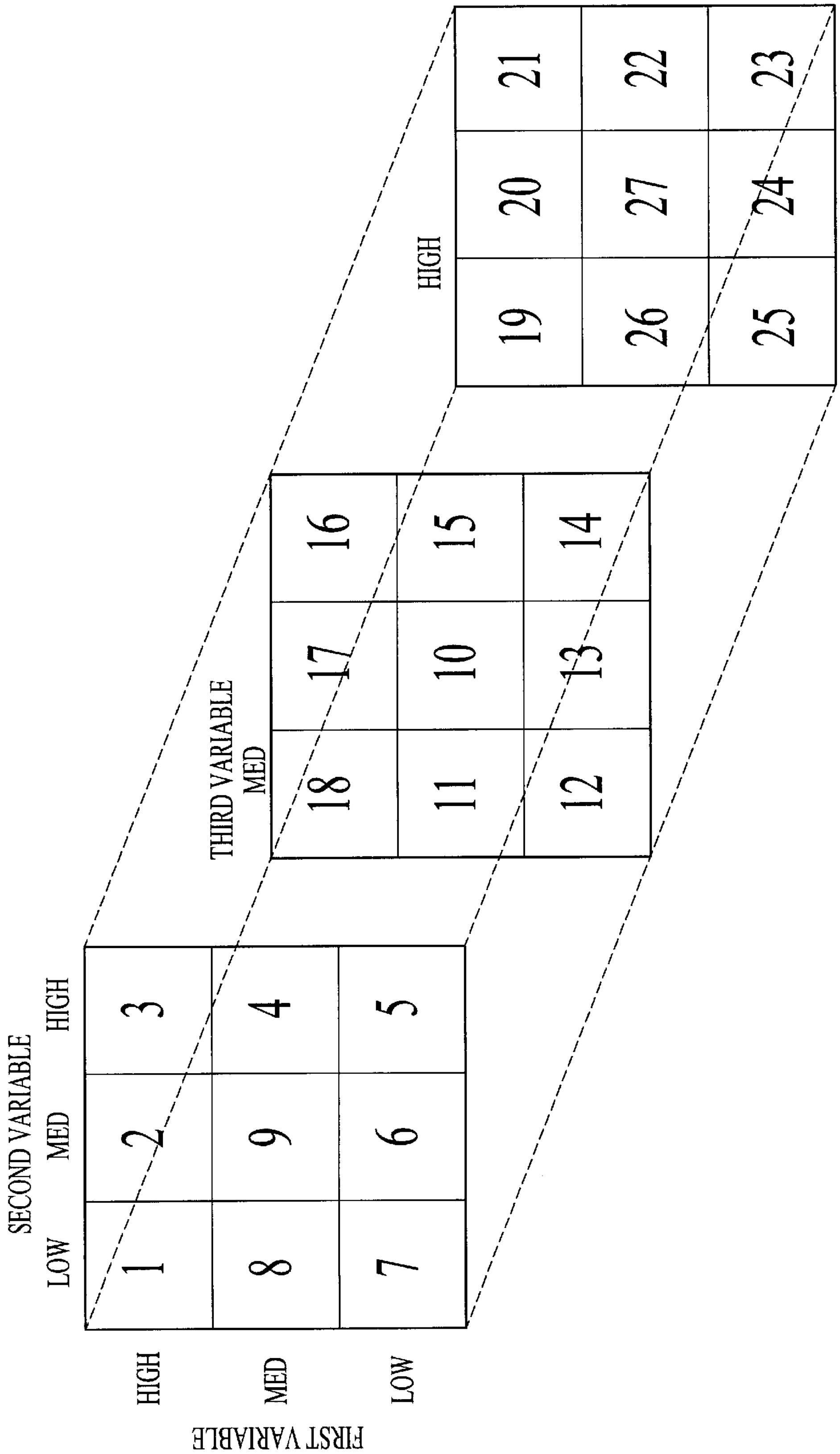
FIG. 9 shows a three dimensional array.

FIG. 1 shows a fuel injector system 30 wherein a representative resistor 32 is varied to provide a plurality of output codes. This circuit, its benefits and further details are all best explained in co-pending U.S. patent application Ser. No. 09/536,365 filed on Mar. 27, 2000, and entitled “IDENTIFICATION OF DIESEL ENGINE INJECTOR CHARACTERISTICS”.

Open and close coils 34 and 40 are associated with upper and lower drivers 36 and 38, and 42 and 44, respectively. A connection 35 to a voltage source passes through a resistance 33. Resistors 60 and 61 lead to a connection 46 which is associated with a control. By controlling the drivers 36, 38, 42 and 44, and selectively energizing certain drivers, a control can sense an output voltage from this circuit. In a disclosed embodiment, all of the drivers are left open, with the driver 44 closed. The circuit then becomes effectively as shown in FIG. 2, with the resistances 62 and 69 providing an output at 46 which is influenced by the value of the resistor 32. As explained more fully in the above-referenced patent application, fuel injectors have been found to have individual characteristics which vary in at least two distinct variables. The variables are identified by a short test as shown generally in 3A. As shown, three different fuel injectors 20, 22 and 24 each are measured for the time to move two distinct quantities of fuel, shown here as 3 and 8. The two points are then utilized to establish an identifying line for each of the fuel injectors 20, 22 and 24. A slope is set as being low, medium or high, and an offset is identified for where the line would cross the 0 fuel line. The offset is also identified as being low, medium or high. A control for the fuel injector will desirably know the combination of characteristics of both slope and offset for the individual fuel injectors. This will effect how the fuel injectors would be best controlled.

As shown in 3B, one non-desirable method of assigning increasing voltages to the several distinct possible values for the two characteristics would be to move from left to right, and then return from left to right. Thus, the code 3 would be associated with high slope and high offset, whereas the code 4 would be associated with a medium slope and a low offset. It should be understood that if a reading error occurs, it will most likely be between two adjacent values. Thus, while a misreading error between 3 and 4 is possible, a misreading error between 3 and 7 is less likely. As disclosed more fully in the above-referenced co-pending patent application, the voltages associated with the values increase with the coded numbers. Thus, it is the adjacent code values which are most likely to be confused by a misreading error.

If a misreading occurs between 3 and 4, then the control will have misidentified both of the actual characteristics of a particular fuel injector. Further, one of the quantities, offset, will be misidentified by two value levels. That is, the actual offset of the particular fuel injector would be "high" whereas the control would have identified it as being "low".

An inventive and beneficial way of assigning such information is illustrated in the following figures. The inventive method minimizes the detrimental effect of a misreading error. Thus, as shown in 4, the code values are assigned in a spiral fashion. One can recognize that should a misreading occur between 3 and 4, the detrimental effect will be minimized compared to the detrimental effect of a misreading error between 3 and 4 in the 3B scenario. In the 4 embodiment, between any two adjacent code values, only one characteristic changes, and that characteristic only changes by one value level. The offset value between 3 and 4 would still be properly identified as being "high". The slope would be off, but it would only be off by one factor. Thus, the invention stores the information in a number of ways which minimize the detrimental effect of the likely misreading errors (i.e., a misreading error between two adjacent code values). While FIG. 4 shows the spiral extending in one direction, and starting in the upper left-hand comer, the spiral can start from any point, and can move in the opposed direction.

FIG. 5 shows a "back and forth" or "mowing the lawn" arrangement. The numbers move along one row, in a first direction and then extend back in the opposed direction. The two main features as described with the FIG. 4 embodiment, that is that only one characteristic changes, and that this characteristic only changes by one value level between any two adjacent values, still applies.

FIG. 6 shows an arrangement which could be identified as "serpentine". The numbers extend through a portion of the rows and columns in reversing direction.

FIG. 7 shows an arrangement which could be entitled a "two strand necklace" or a double-u shape. The FIGS. 5–7 embodiments are not associated with particular quantities for their two values. This is to illustrate two points. First, while the FIG. 3 and 4 embodiments only discuss three values within each of the characteristics, obviously some quantities could have many more values. FIGS. 5–6 illustrate the invention applied to four value levels, but should also be understood that even more levels would benefit from this invention. Moreover, the FIGS. 5–7 illustrate that the invention is not in any way limited to identification of features with regard to fuel injector operation characteristics.

It should also be understood that while each of the embodiments are shown as square, the invention would extend to non-square or rectangular arrangements such as is shown in FIG. 8.

FIG. 9 shows a three dimensional array. The three dimensional array is assigned in a somewhat spiral fashion, however, between each of the third dimension there is movement in an axial direction. As can be appreciated, the movement between any one of the assigned codes shown in FIG. 9 would be similar to as described above. Between any two adjacent numbers, there is only a change in one characteristic, and that characteristic only changes by one value level.

Preferred embodiments of this invention have been disclosed, however, a worker in this art would recognize that certain modifications would come within the scope of this invention. For that reason, the following claims should be studied to discover the true scope and content of this invention.

What is claimed is:

1. A method of assigning increasing values to provide an identification code for components having at least two distinct characteristics of varying amounts comprising the steps of:

obtaining information with regard to said at least two distinct characteristics each having several possible value levels;

assigning an identification code to said component based upon the combination of said at least two distinct characteristics, said identification code being associated with a physical characteristic, said physical characteristic changing with each increasing code; and each increasing code being assigned to a particular combination of said at least two distinct characteristics such that between any two adjacent codes, only one of the two distinct characteristics has changed, and that said one of said two distinct characteristics only changes by one value level.

2. A method as set forth in claim 1, wherein said physical characteristic is an electrical characteristic.

3. A method as set forth in claim 1, wherein said codes are utilized to provide characteristics relative to a fuel injector.

4. A method as set forth in claim 1, wherein said codes are arranged in a spinal array.

5. A method as set forth in claim 1, wherein said codes are arranged to extend along a plurality of rows and columns in reversing directions.

6. A method as set forth in claim 1, wherein said codes are assigned in a serpentine fashion.

7. A method as set forth in claim 1, wherein said codes are assigned in a double-u shaped arrangement.

8. A method as set forth in claim 1, wherein there are three of said characteristics, with said increasing codes being assigned to particular combinations of said three characteristics such that between any two adjacent increasing codes, only one of the three characteristics is changed, and said one characteristic changes by one value level.

9. A control for a physical system comprising:

an input for receiving a physical electrical characteristic from a system, said electrical characteristic being associated with particular code indentifying two distinct characteristics of said system, and said control being operable to effect an output, and control a physical system based upon said identified code; and said control storing information about said code, including increasing code values assigned to particular combinations of said two distinct characteristics of said system such that between any two adjacent increasing codes, only one of said two distinct characteristics change.

* * * * *